United States Patent
Kekare et al.

(10) Patent No.: US 9,400,865 B2
(45) Date of Patent: Jul. 26, 2016

(54) EXTRACTING COMPREHENSIVE DESIGN GUIDANCE FOR IN-LINE PROCESS CONTROL TOOLS AND METHODS

(71) Applicant: KLA-Tencor Corporation, Milpitas, CA (US)

(72) Inventors: Sagar A. Kekare, Milpitas, CA (US); Sergei G. Bakarian, Mountain View, CA (US)

(73) Assignee: KLA-Tencor Corp., Milpitas, CA (US)

( * ) Notice: Subject to any disclaimer, the term of this patent is extended or adjusted under 35 U.S.C. 154(b) by 0 days.

(21) Appl. No.: 14/735,596

(22) Filed: Jun. 10, 2015

(65) Prior Publication Data
US 2015/0363537 A1 Dec. 17, 2015

Related U.S. Application Data

(60) Provisional application No. 62/012,155, filed on Jun. 13, 2014, provisional application No. 62/136,364, filed on Mar. 20, 2015.

(51) Int. Cl.
*G06F 17/50* (2006.01)

(52) U.S. Cl.
CPC ........ *G06F 17/5081* (2013.01); *G06F 17/5009* (2013.01)

(58) Field of Classification Search
CPC ........................................ G03F 1/144
USPC ........................................... 716/52
See application file for complete search history.

(56) References Cited

U.S. PATENT DOCUMENTS

| | | | |
|---|---|---|---|
| 6,902,855 B2 | 6/2005 | Peterson et al. | |
| 7,379,175 B1 | 5/2008 | Stokowski et al. | |
| 7,418,124 B2 | 8/2008 | Peterson et al. | |
| 7,570,796 B2 | 8/2009 | Zafar et al. | |
| 7,676,077 B2 | 3/2010 | Kulkarni et al. | |
| 7,694,267 B1* | 4/2010 | Ye | G03F 1/144 716/53 |
| 7,769,225 B2 | 8/2010 | Kekare et al. | |
| 7,774,153 B1 | 8/2010 | Smith | |
| 8,041,106 B2 | 10/2011 | Pak et al. | |
| 8,213,704 B2 | 7/2012 | Peterson et al. | |
| 2009/0055783 A1 | 2/2009 | Florence et al. | |
| 2010/0215247 A1* | 8/2010 | Kitamura | G06T 7/001 382/149 |
| 2010/0235134 A1 | 9/2010 | Xiong | |
| 2012/0131527 A1 | 5/2012 | Kekare | |
| 2014/0105482 A1 | 4/2014 | Wu et al. | |
| 2015/0370175 A1* | 12/2015 | Nicolaides | G01N 21/9503 355/77 |

OTHER PUBLICATIONS

International Search Report for PCT/US2015/035397 mailed Aug. 31, 2015.

\* cited by examiner

*Primary Examiner* — Suresh Memula
(74) *Attorney, Agent, or Firm* — Ann Marie Mewherter (57) ABSTRACT

Methods and systems for extracting comprehensive design guidance for in-line process control of wafers are provided. One method includes automatically identifying potential marginalities in a design for a device to be formed on a wafer. The method also includes automatically generating information for the potential marginalities. The automatically generated information is used to set up process control for the wafer.

53 Claims, 1 Drawing Sheet

EXTRACTING COMPREHENSIVE DESIGN GUIDANCE FOR IN-LINE PROCESS CONTROL TOOLS AND METHODS

BACKGROUND OF THE INVENTION

1. Field of the Invention

This invention generally relates to methods and systems for extracting comprehensive design guidance for in-line process control of wafers.

2. Description of the Related Art

The following description and examples are not admitted to be prior art by virtue of their inclusion in this section.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing, etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers. Inspection processes have always been an important part of fabricating semiconductor devices such as integrated circuits. However, as the dimensions of semiconductor devices decrease, inspection processes become even more important to the successful manufacture of acceptable semiconductor devices. For instance, as the dimensions of semiconductor devices decrease, detection of defects of decreasing size has become necessary since even relatively small defects may cause unwanted aberrations in the semiconductor devices.

Other process control may be performed on a wafer during or after fabrication of a device on the wafer. For example, once a wafer has been inspected for defects, one or more defects detected in the inspection may be reviewed in a defect review process. The defect review process may be performed on a different tool than that used for inspection, which may be optimized for defect review. Additional information generated during the defect review process may be used to classify and/or filter the defects detected on the wafer. Metrology processes may also be performed on wafers. In these processes, one or more characteristics of the wafer such as linewidth, film thickness and the like are measured. These processes may also be performed by tools that are optimized for and dedicated to metrology. In addition, failure analysis (FA) processes may be performed on wafers in which information about physical characteristics of the wafers is determined, usually based on electrical testing results for the wafers.

In some instances, process control for wafer fabrication such as the examples described above is performed based on the design of the device being formed on the wafer. For example, some guidance for in-line inspection, review, and metrology is beginning to come from design teams today. However, such guidance usually covers only a relatively small segment of what the design teams know about their chip designs and what could be substantially useful for in-line inspection and metrology. In addition, there is a substantially marked lack of automation used to create such guidance today.

There are, therefore, a number of disadvantages to the current methods and systems for guiding process control based on design data. For example, the currently used methods are slow to the point of being impractical to cover the entire spectrum of a design team's knowledge about their chip design. In addition, some types of design teams' knowledge are easier than others for in-line inspection and metrology systems to consume, e.g., design-for-manufacturing (DFM) errors, physical FA locations picked by product engineering analysis, etc. Furthermore, the scale of such inputs remains a substantially small percentage of actual observations due to lack of automation.

Accordingly, it would be advantageous to develop methods and systems for extracting comprehensive design guidance for in-line process control of wafers that do not have one or more of the disadvantages described above.

SUMMARY OF THE INVENTION

The following description of various embodiments is not to be construed in any way as limiting the subject matter of the appended claims.

One embodiment relates to a computer-implemented method for generating information for setting up process control for a wafer. The method includes automatically identifying potential marginalities in a design for a device to be formed on a wafer. The method also includes automatically generating information for the potential marginalities. The automatically generated information is used to set up process control for the wafer. Automatically identifying the potential marginalities and automatically generating the information are performed by one or more computer systems.

Each of the steps of the method described above may be performed as described further herein. The method described above may include any other step(s) of any other method(s) described herein. The method described above may be performed using any of the systems described herein.

Another embodiment relates to a non-transitory computer-readable medium storing program instructions executable on a computer system for generating information for setting up process control for a wafer. The computer-implemented method includes the steps of the computer-implemented method described above, which may be performed as described further herein. In addition, the computer-implemented method for which the program instructions are executable may include any other step(s) of any other method(s) described herein. The non-transitory computer-readable medium may be further configured as described herein.

An additional embodiment relates to a system configured to generate information for setting up process control for a wafer. The system includes a process control tool configured to determine information for one or more characteristics of a physical version of a wafer on which at least a portion of a device has been formed. The system also includes one or more computer subsystems configured for automatically identifying potential marginalities in a design for the device. The computer subsystem(s) are also configured for automatically generating information for the potential marginalities. The automatically generated information is used to set up process control for the wafer performed by the process control tool. The system may be further configured as described herein.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

One embodiment relates to a computer-implemented method for generating information for setting up process control for a wafer. As will be described further herein, the embodiments can be used for selective physical extraction of integrated circuit (IC) design marginalities for guiding in-line inspection, review, and metrology during fabrication and failure analysis (FA) after testing. For example, the process control may include an inspection process, a defect review process, or a metrology process performed during fabrication of a device on a wafer. In addition, the process control may include an FA process performed after electrical testing of the device. Such process control may include any such process control known in the art. The process control may be performed by any suitable process control tools including those described further herein.

The method includes automatically identifying potential marginalities in a design for a device to be formed on a wafer. For example, the general purpose of the embodiments described herein is to guide in-line inspection, review, and metrology operations in a fab and FA operations after testing to geometrically specific areas within a chip, which have been deemed to be deserving of special attention during fabrication. In one embodiment, the potential marginalities are automatically identified based on information provided by a designer of the device. For example, the geometrically specific areas within the chip may be deemed to be deserving of special attention during fabrication by a designer. In addition, design elements that are new or unique may be identified as potential marginalities since their fabrication and performance may be largely unknown. In another embodiment, the potential marginalities are automatically identified based on information about electrical, logical, functional, and behavioral attributes of different areas within the device. For example, the geometrically specific areas within the chip may be deemed to be deserving of special attention during fabrication in terms of their electrical, logical, functional, and behavioral attributes. Such attributes may be determined in any suitable manner.

In one embodiment, at least one of the potential marginalities is discovered through a simulation. For example, the reasons for the need for special attention during fabrication may be a marginality discovered through simulations (e.g., of the device function and/or the device fabrication). In another embodiment, at least one of the potential marginalities is discovered through information about criticality of a design element for function or testing of the device. For example, the reasons for the need for special attention during fabrication may be criticality of a design element for the purpose of function or test. In a further embodiment, at least one of the potential marginalities is discovered through prior knowledge of functional or performance deficiencies of a design element of the device. For example, the reasons for the need for special attention during fabrication may be prior knowledge of functional or performance deficiencies of a design element (e.g., through test and/or diagnostics). In addition, the reasons for the need for special attention during fabrication may be any or all of such information about design elements in the device.

Automatically identifying the potential marginalities may include a first set of steps that begin with the various electrical, logical, functional, and behavioral sign-off verification results for the chip design such as: 1) static timing analysis sign-off in all its variants; 2) signal integrity sign-off; 3) latch-up and electrostatic discharge (ESD) rule checks; and 4) electromigration rule checks. Criteria may be applied to these results to select some or all of the design elements flagged by each of the above-mentioned sign-off/verification steps. The criteria could be related to the specific attribute of design checked during each sign-off or any combination of these and other parameters related to the design team's understanding of their chip design. The design elements thusly selected may be identified through their electrical, logical, functional, or behavioral names.

Automatically identifying the potential marginalities may also include a second set of steps based on a design team's knowledge of specific entities embedded within the design. Such specific entities may include design elements used with a sense of compromise, e.g., a standard cell used for its high drive but also known for its leakage characteristics. In one embodiment, at least one of the potential marginalities is identified based on electrical relevance of elements of the design to function of the device. For example, the specific entities may be design elements used with none or diminished electrical relevance to chip function, e.g., a standard cell used purely as a filler and not connected in any way to the actual circuit or a redundant cell that is used for assurance. In another embodiment, at least one of the potential marginalities is identified based on one or more elements of the design that are designed for testability of the device. For example, the specific entities may be design-for-testability (DFT) elements such as scan chains, scan flops, registers, etc. In addition, the specific entities may be design elements which are at the limits of the current manufacturing capabilities based on the design team's prior knowledge from test chip characterization or from prior silicon FA of the chip. In a further embodiment, at least one of the potential marginalities is identified based on constraints on performance of a block in the design. For example, the specific entities may be so called "IP" blocks that have substantially high constraints on performance, such as matched pairs in analog circuitry, etc.

The method also includes automatically generating information for the potential marginalities. The automatically generated information is not sufficient for use in fabrication of the device in its entirety. Instead, the information is only suitable for setting up process control and potentially for use in performing process control. The information generated as described herein may not be used to fabricate the device since only information for the identified potential marginalities may be included in the information. For instance, the automatically generated information is insufficient to fabricate the entire device since it describes the device in a manner limited by a certain criteria to grade the various elements within the design. As such, the generated information may not include all of the necessary information needed to fabricate the device.

In one embodiment, automatically generating the information includes querying design elements corresponding to the potential marginalities against a physical design database for the device. For example, the design elements selected as described above may be queried against a physical design database for the chip design. This database can exist in several manifestations depending on the nature of the chip's circuitry, the design automation tools used, a preference of the design team, etc. Most often encountered databases may be library exchange format-design exchange format (LEF-DEF), layout versus schematic (LVS), etc., but other uncommon databases may be used as well.

In another embodiment, automatically generating the information includes generating a design data file containing physical design elements that result from the querying. In an additional embodiment, the automatically generated information for the potential marginalities includes one or more physical attributes of physical design elements in the design corresponding to the potential marginalities. For example, the physical design elements that match the query can be identified from the database and annotated within the database, duplicated as a separate table within the database, or completely separated out as a new independent database. The physical design elements identified by the querying are also available for output as a GDS or OASIS file, or any other acceptable file format that can be communicated and read to perceive the physical location, shape, perimeter, aspect ratio, orientation, symmetry, or any such physical attribute of the physical design elements included therein. In addition, the physical design elements may be organized in any of the hierarchical structures offered by GDS, OASIS, and other such formats. Such organization may reflect the entire range of attributes associated with the physical design elements or any subset of them.

In some embodiments, the method includes modifying one or more physical design elements in the design corresponding to the potential marginalities based on one or more parameters of the process control. For example, the physical design elements identified as described herein may be modified to best benefit from inspection, metrology, or other types of process control described herein. Such modifications may cover the entire spectrum of structural as well as contextual changes to all or some of the physical design elements.

The steps described above may be applied to an entire system on a chip (SoC) chip device, in a separable manner to individual blocks within a complex chip, or even at the sub-block unit level, with the ability to recombine the results again at the full SoC level. In addition, the steps described above may allow for a variety of IP vendors to report their own set of guidance for process control to be performed for their respective IP blocks. Such IP level guidance can be combined with the design team's guidance to arrive at the full SoC level guidance.

The automatically generated information is used to set up process control for the wafer. For example, the results of the steps described above may be used to create a nomenclature for the physical design elements that can be used to manage appropriate treatment of each of the elements during one or more types of the process control described herein. In one such example, the automatically generated information may include information about where the process control should be performed on the wafer, where to sample on the wafer during process control, etc. such that the information can provide guidance about where process control should be performed on the wafer possibly in combination with guidance about how such process control should be performed (e.g., what type of measurements and the like). Setting up the process control may include determining one or more values for any parameters of the process control including output acquisition parameters (e.g., parameters of an optical subsystem, an electron beam subsystem, etc.) and output processing parameters (e.g., parameters of a computer subsystem used to process output of one or more detectors of a process control tool).

The process control parameters may also be determined on a potential marginality basis. For instance, in one embodiment, the automatically generated information includes information indicating different types of the potential marginalities. Such information may include some sort of ID or code for the different types of potential marginalities. The ID or code may indicate why the potential marginalities were identified as marginalities thereby separating the potential marginalities by type. In some embodiments, the information indicating the different types of the potential marginalities is encrypted by an owner of the design. For example, the codes or IDs assigned to different potential marginalities may be assigned by the design owner and have meanings that are known only to the design owner. In some such embodiments, the information indicating the different types of the potential marginalities is used to set up different types of the process control for the wafer. In one example, for each of the different types of potential marginalities included in the generated information, parameters of the process control may be separately determined. In this manner, the parameters of the process control may be varied from potential marginality to potential marginality on the wafer. In this manner, if a potential marginality corresponds to a single design element in the design, the parameters of the process control can be varied on the design element level (i.e., from design element to design element) although other levels of variation are possible as well.

As described further above, the potential marginalities are identified automatically in a number of different ways. In addition, the potential marginalities that are identified may include all of the potential marginalities in the device. Therefore, the embodiments described herein have a number of significant advantages over currently used methods for guiding yield control processes based on design. For example, any of the previously tried methods for guiding in-line inspection, review, and metrology do not exhibit such detailed automation of the method steps, and, as such, they fail to comprehensively bring the entire spectrum of a design team's knowledge to bear on the efficiency and effectiveness of in-line inspection and metrology. In addition, considering the massive automation that has taken over the typical IC design flow, no alternate paths have been identified to achieving the capabilities of these embodiments in their complete scale and scope.

In another embodiment, automatically identifying the potential marginalities and automatically generating the information are performed by a fabless entity, and the process control is set up based on the automatically generated information by a fab after receiving the information from the fabless entity. For example, the design-based embodiments described herein create differentiated value for process control data with fabless design houses since they can demand certain process control data from their fabs. In addition, the embodiments described herein can enable fabless design houses to not only ask for certain process control data, but also to prescribe to their fabs about where and when process control data needs to be collected.

The embodiments described herein, therefore, advantageously combine the most comprehensive information available in the most automated fashion possible for design-guided process control. For example, for the very first time, the embodiments described herein offer a path to assimilating an entire new body of knowledge in efforts to make in-line inspection and other process control more effective and efficient. In addition, the embodiments described herein are designed to benefit from a majority of the elements of existing chip design automation flow, thus achieving a highly economic way for ensuring design teams' cooperation in these efforts. For example, in one embodiment, at least some of the potential marginalities are automatically identified at different points in an electronic design automation (EDA) process performed for the design, and the automatically generated information includes information for at least two of the potential marginalities that are automatically identified at the different points in the EDA process. In this manner, the potential marginalities may be automatically identified at different points in time, but all or at least some of the potential marginalities that are identified may be considered collectively or simultaneously to automatically generate the information as described herein, in other words, different portions of the identified potential marginalities may be separately identified at different points in time (e.g., at different steps in the EDA process), but the identified potential marginalities that are used to generate the information may include any or all of the potential marginalities. In this manner, the automatically identified potential marginalities that are used to generate the information that will be used for setting up process control may effectively be a superset of all potential marginalities that may have been identified in different processes and/or at different times. As such, the automatically identified potential marginalities that are used to generate the information that will be used for setting up process control may be a combination of multiple sources of design marginalities.

Furthermore, the embodiments described herein are comprehensive in their input to allow for a priori guidance from a design team ahead of any silicon, as well as continuous learning based on early silicon tests and diagnostics. For example, in one embodiment, the design for the device used for automatically identifying the potential marginalities includes design information that is available prior to design rule checking (DRC) performed on the design. In addition, in another embodiment, at least some of the potential marginalities are automatically identified prior to DRC performed on the design. The embodiments described herein can also be used to complement additional efforts for using design in inspection and metrology along the lines of design-based binning (DBB) and context based inspection (CBI), examples of which are described in U.S. Pat. No. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. In addition, the embodiments described herein can be used to help downstream analysis teams in fabs and in design houses. For example, the same automatically generated information may be used to correlate process control data to potential marginalities in the design thereby facilitating differentiation between potential marginalities and actual marginalities as well as correlation of actual process control data and potential marginalities.

As noted above, the embodiments described herein involve identifying individual design elements that correspond to potential marginalities, which can then be used to determine one or more parameters of the process control based on the identified individual design elements. In this manner, in some instances, parameters of the process control may be determined on a design element scale such that the parameters can vary from design element to design element. Therefore, in some instances, it may be helpful to be able to identify the location of output (e.g., images, measurements, etc.) produced by the process control on a design element level or with respect to the design. Some particularly useful methods and systems for aligning such output to design data are described in the above-referenced patents to Zafar and Kulkarni. In addition, some particularly useful commercially available products for performing such alignment include the NanoPoint™ product that is commercially available from KLA-Tencor, Milpitas, Calif. The embodiments described herein may take advantage of or incorporate such methods and systems to thereby pair the NanoPoint product with volume diagnostics for yield learning and corrective actions.

in terms of wafer inspection, defect inspection commonly includes scanning in a swath across multiple dies (say, Die A, Die B, and Die C) on the wafer. Dies A and C may be located on opposite sides of Die B. During defect detection, the output generated at corresponding within-die locations may be compared for the following die pairs: Dies A and B; Dies B and C; and Dies A and C. Any differences detected between the different die pairs may be noted. If there are differences between the die pairs, the die that is common to the die pairs that produce the differences can be identified as the defective die. For example, if the comparisons of Dies A and B and Dies B and C showed a difference, but the comparison between Dies A and C did not, the common element for the difference is Die B. Therefore, it can be determined that the defect is located in Die B. Such defect detection is commonly referred to as double arbitration (since it involves comparing one die to two others).

In some currently used inspection processes, care areas are used to mark large areas in a chip that are to be treated differently than other parts of the chip. For example, some care areas may correspond to memory arrays in the chip, and those areas may be inspected using a cell-to-cell comparison. Other care areas may correspond to dense logic area(s) in the chip, and those area(s) may be inspected at relatively high sensitivity (compared to other areas in the chip). Additional care areas may correspond to nominal logic area(s) in the chip, and those area(s) may be inspected at nominal sensitivity and filter(s). Further care areas may correspond to analog block(s) in the chip, and those areas may be inspected with nominal sensitivity.

NanoPoint has proved useful for a number of reasons including that it allows the care areas on the wafer used for inspection to be dramatically reduced in size. For example, in commonly performed inspection, relatively large care areas are used (e.g., care areas greater than 10 microns). Therefore, the number of care areas in a chip that can be used in this inspection is relatively low. In contrast, NanoPoint allows millions of micro care areas (MCAs) or nano-care areas to be used that may have a size of about 350 nm, for example. The care areas for NanoPoint can be generated in a rule-based manner based on a number of different rules such as a rule for active areas, a rule for edges of an array, a rule for a region within a cell, a rule for dense and isolated thin lines, a rule for cell centers, a rule for overlapping features, a rule for an array, a rule for cell extents, or a combination thereof. In general, there are a few basic rules that are used when generating care areas on a new chip. These rules are not fixed and can be edited or appended by teams that know the chip and its sensitive regions.

NanoPoint is essentially guided inspection that can be implemented in two modes in-line. The first is CBI, which is design enabled NanoPoint, and can be performed as described in the above referenced patents. The second is target based inspection (TBI), which is image enabled NanoPoint, and can be performed as described in U.S. Patent Application Publication No. 2014/0105482 by Wu et al. published on Apr. 17, 2014, which is incorporated by reference as if fully set forth herein. The embodiments described herein may include any steps described in this publication and may be further configured as described in this publication.

As such, in conventional inspection, one detection threshold may be used for an entire care area, which due to its relatively large size, may include output (e.g., signals) for a defect but also possibly multiple outputs for noise. Therefore, in order to detect a defect, many noise signals may also be flagged as defects even though they are only noise. In contrast, when using the substantially small care areas provided by the NanoPoint product, the detection threshold can be changed many times (e.g., every time a different micro or nano care area is scanned) in the same wafer area as one previously used care area. Therefore, as that same wafer area is scanned, the detection threshold can be modulated more frequently based on at least the noise in the output thereby allowing detection of more defects and less detection of noise as potential defects. As such, wafer inspection performed using NanoPoint care areas will have better defect signal and coordinate accuracy than previously used inspection. In addition, inspection performed using NanoPoint care areas will have less noise from the layout pattern and substrate than previously used inspection.

The NanoPoint product can be used in a number of different applications including a full spectrum of yield-related activities. For example, information from a number of different sources may be used to determine information about the device being formed on a wafer such as power domains, speed paths, critical timing paths, parasitic bridges, design rule check (DRC) flags, and DFM/optical rule check (ORC) flags. That information may then be used to predict where in the device there might be potential marginalities, which may be performed as described further herein. Process control related data from a number of different sources may also be used in the NanoPoint product to determine information about the physical wafer and may include mask defects, mask metrology, wafer inspection, wafer metrology, fabrication tool monitors, work in progress (WIP) data, etc. The process control related data may then be used with the predicted information to validate the predicted information. In addition, the process control related data may be used with the predicted information to correct the design, the fabrication process, the process control, or a combination thereof. In this manner, the NanoPoint product more fully integrates information about the design, process, and test than has ever been done before at a granularity that was previously not possible.

As described more fully above, the embodiments described herein may include identifying and accumulating all predicted weaknesses for a design of a device to be formed on a wafer. These steps could be made to be part of a nominal computer-aided design (CAD) flow. Information for all of those predicted weaknesses can then be used as described herein to generate appropriate guidance for detection and process control in a fab. For example, as described further herein, the information may be generated by a fabless entity and then handed off to a fab to set up process control. Alternatively, the information may be generated by a fabless entity and then used by the fabless entity to set up process control that is then sent to a fab for use during chip fabrication. All of these steps may also be performed by a fab. Furthermore, if one entity (e.g., a fabless entity) produces information for potential marginalities in a design, that information may be handed off to another entity (e.g., a fab) who adds to that information for additional potential marginalities. That combined information may then be used to generate process control methods. For example, one entity can generate as much information about all potential marginalities known to them on a design side of chip fabrication and then another entity can add to that information with information about all potential marginalities known to them on a fabrication side of chip fabrication (e.g., foundry processes, simulations for ORC, CMP, etc.). That combined information can then be used to generate process control as described further herein.

During fabrication of the device on the wafer, data can be gathered from all process control methods including any and all of those described herein. The steps performed prior to and including gathering data through process control may form a "predict-detect" loop for a "first-time right" approach. In other words, predicting all potential weaknesses and then performing one or more process control methods based on those potential weaknesses may provide the possibility of fabricating the device correctly on silicon in the first attempt.

In some instances, automatically identifying the potential marginalities may be performed as formal optical verification. For example, a device designer may iteratively change the design to minimize potential marginalities (or "tight spots") in the design. The tight spots in the design may be identified by a fabless company at tapeout, thereby generating "third sigma" content. The tight spots may be defined as areas or features in the design that may be potential marginalities. Additional tight spots may be identified by specific foundry methods such as ORC, DRC, DRC+post fill add, etc. These tight spots may also be defined as areas or features in the design that may be potential marginalities. Some of the tight spots identified by the fabless company may overlap with tight spots identified by the foundry while other tight spots may be identified exclusively by one or the other. In any case, all of the tight spots identified by the fabless company may be combined with the tight spots identified by the foundry to produce an "optical verification" superset, or a specified set to be inspected before first silicon.

The data for all predicted weaknesses in combination with the data gathered from all process control can be correlated to any electrical fails and can be used to prioritize follow up actions performed based on the electrical fails. The correlated process control data and electrical fail data may also be used to drive appropriate corrective actions for the device fabrication. The steps described above including the data gathering from process control methods and steps that may be performed after that may form a "validate-correct" loop for a rapid learning approach.

The embodiments described above may be used for a "nano-diagnostics" application. In this application, DFM may be used in combination with diagnostics as well as process window qualification (PWQ). PWQ has not been used before with DFM and diagnostics. This application is enabled by a combination of scan diagnosable test chips with DFM variants, PWQ with NanoPoint inspection, and production monitoring on PWQ sites using NanoPoint.

PWQ type inspections have proved valuable as lithography process windows continue to shrink with every technology node. For example, the loss of process window is not uniform across all possible pattern shapes. In particular, certain shapes offer less lithography process margins than the rest of the chip. Discovering such marginal shapes is critical for process centering and yield. PWQ inspection may be performed as described in U.S. Pat. No. 6,902,855 to Peterson et al. issued on Jun. 7, 2005, U.S. Pat. No. 7,418,124 to Peterson et al. issued on Aug. 26, 2008, U.S. Pat. No. 7,769,225 to Kekare et al. issued on Aug. 3, 2010, U.S. Pat. No. 8,041,106 to Pak et al. issued on Oct. 18, 2011, and U.S. Pat. No. 8,213,704 to Peterson et al. issued on Jul. 3, 2012, which are incorporated by reference as if fully set forth herein. The embodiments described herein may include any step(s) of any method(s) described in these patents and may be further configured as described in these patents.

PWQ generally involves printing a special wafer in which different dies are printed at different conditions (i.e., different modulated conditions) of the exposure tool. Inspection is then performed on that wafer at a relatively high sensitivity. Based on the results of that inspection, marginal shapes can be extracted and prioritized. Defect review of the extracted marginal shapes may then be performed for confirmation. Process centering based on the determined limits of the exposure may then be performed based on the shapes confirmed as marginal.

There are a number of challenges commonly seen in PWQ. For example, in the inspection at relatively high sensitivity, too many shapes may be captured as potentially marginal. Therefore, it can be difficult to pick out only the ones that are critical and relevant to chip functioning. In other words, it can be difficult to filter out non-critical shapes. For example, it can be difficult to separate defects of interest such as a bridging defect from other defects that are detected due to global noise such as bumps and roughness. In addition, in the extraction and prioritization of the marginal shapes, a marginal shape may be captured several times across a chip. Grouping and classifying similar shapes may be performed in a number of different manners such as design based grouping (DBG), which may be performed as described in the above-referenced patents to Zafar et al. and Kulkarni et al., that may be performed based on patterns of interest in a design for the device. However, it can be difficult to group and classify similar shapes correctly to achieve bin accuracy and purity.

Such an application would achieve maximized chances of success on first silicon. For example, the embodiments described herein may be used for watching for all known weaknesses at the highest sensitivity possible and filtering out all of the noise sources. In addition, such an application can achieve rapid yield learning by getting quickly to what are the most important yield learning mechanisms that need to be addressed. Furthermore, such an application can achieve precise corrective guidance by adjusting any or all of design, process, and test plans of record to retire the risk from the discovered mechanisms.

Taking a deeper look at the "validate-correct" loop, in the current best case root cause analysis flow, the most important and lengthy step is failure site prioritization to ensure that only the most important sites go to physical failure analysis (PFA). For example, in the functional areas of a device, the failure observation may be BIN failures, failure localization may include electrical failure analysis (EFA) techniques, e.g., IR emission, etc., and the failure site prioritization may be performed based on BIN yield impact. The failure mechanism may then be examined by typical PFA. In memory areas of a device, the failure observation may be bit failures, the failure localization may include a bit-mapping approach to failed bits and signatures, and the failure site prioritization may be performed based on bit signature yield impact. The failure mechanism may then be examined as typical PFA plus bit-cell simulations. In logic areas of a device, the failure observation may be scan failures, the failure localization may include a diagnostics approach to failing cells and nets, and the failure site prioritization may be performed based on cell/net yield impact. The failure mechanism may be examined by typical PFA plus Nanoprobe or laser shift.

In the "validate-correct" loop, there are situational differences in ramp versus production. For example, in the phase of a product life cycle, yield ramp happens before volume production. In the yield ramp phase, a typical pareto of PFA candidates may present a few obvious outliers thereby rendering the choice for PFA relatively easy. However, in a typical pareto of PTA candidates in the volume production phase, the pareto may not show any obvious outliers thereby rendering the choice of defects for PFA relatively unclear.

In-line defect data may be able to help in PFA sampling by looking back to in-line data. For example, sort fail locations may be determined as die level failures. In addition, defect locations may be determined for defects detected at the die level. Sort fail locations may also be determined as block level failures. In addition, defect locations may be determined for defects detected at the block level. Therefore, in both of these situations, for PFA decisions, it may be okay to suspect a defect contribution to a fail and use the corresponding location for PFA. Otherwise, lengthy EFA may be needed to determine the location for PFA. Similar decision making may also be possible for sort fail locations determined for cell/net level features.

There are some challenges in defect-to-test correlation. For example, in the yield ramp phase, a relatively high defect density may be detected. Therefore, many defects may be determined to correlate to failing cells/nets. As such, it may be difficult to decide if PFA is unnecessary. In one such example, there may be three defects that correlate to a design commonality. As such, it may be difficult to determine which one should be treated as the killer defect. In the volume production phase, design systematic defects may be identified. In addition, design-process interactions mandate relying on rich in-line data. However, when no design commonality stands out for the detected defects, it may be difficult to determine if the defect types, layers, and patterns indicate anything.

In yield loss root cause analysis, PFA can be a bottleneck. For example, multiple wafers may be processed and inspected. The processes may include, for example, film formation, lithography, etch/implant, polishing, etc. The inspection steps may include inspection, defect review, and data archival. The finished wafers may then be tested in tests such as functional, scan, MBIST, IDDq/Param, etc. The failed dies may then be sampled for PFA based on diagnostics, analysis, and pareto generation. PFA performed on the sampled failed dies is relatively slow for even a few dies.

PFA can be a bottleneck for a number of reasons. For example, diagnostics techniques deliver accurate polygon level failure localization. PFA is often the only confirmation of failure mechanisms to drive corrective actions. Yield learning is slow due to serial cumulative discovery of failure mechanisms. Inspection and defect review data can offer a way around the PFA bottleneck if defect coordinate accuracy is relatively high and scanning electron microscope (SEM) images for the defects are available.

The embodiments described herein can be used to relax the PFA bottleneck in yield loss root cause analysis. For example, multiple wafers may be processed and inspected. The finished wafers may then be tested. In addition, the failed dies may be sampled for PFA to select a few of the failed dies and only the important failed dies. For example, the process control data generated during fabrication of the wafer (e.g., by inspection, defect review, and metrology) may be used for polygon level accurate correlation of the in-line data to the test results. Diagnostics techniques deliver accurate polygon level failure localization. In addition, NanoPoint and e-beam defect review offer polygon level defect localization with images. Therefore, a defect-to-diagnostics correlation can prioritize the PFA on the undiscovered defects. This correlation could be performed by the NanoPoint product since NanoPoint can easily accept polygon level failure localization from diagnostics. In this manner, such sampling performed for PFA can relax the PFA bottleneck. In addition, the results of sampling the failed dies for PFA may be fed back to the process and inspect steps to target the sensitivity of the yield control processes to systematic failing features.

In one embodiment of a NanoPoint implementation and potential method steps, design flags and context rules may be used to determine NanoPoint care areas. In this manner, the design flags and context rules may be fed forward to optimize the inspection plan on the device. The NanoPoint care areas may then be used to determine a NanoPoint inspection recipe (e.g., a PWQ type inspection and/or a nominal inspection). PFA may then be performed in correlation with volume diagnostics by feedforward of the inspection results to optimize the PFA sample plan on the inspected device. The results of PFA may then be used to perform a number of steps such as validating DFM predictions, discovering new systematic defects, and performing excursion control for known systematic defects. Results of one or more of the steps performed based on the PFA results may be fed back to optimize the inspection plan used for the inspected device and also generically inspection plans for any other devices. Results of one or more of the steps performed based on the PFA results may also be fed back to DFM for additions and/or edits to the library or rules.

The steps of the computer-implemented method such as automatically identifying the potential marginalities and automatically generating information for the potential marginalities are performed by one or more computer systems, which may be configured as described further herein.

All of the methods described herein may include storing results of one or more steps of the method embodiments in a computer-readable storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc.

Figure 1:
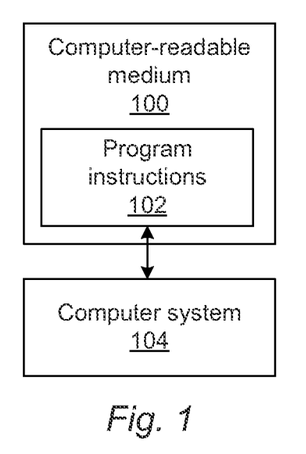
FIG. 1 is a block diagram illustrating one embodiment of a non-transitory computer-readable medium storing program instructions executable on a computer system for performing one or more of the computer-implemented method embodiments described herein.

Another embodiment relates to a non-transitory computer-readable medium storing program instructions executable on a computer system for performing a computer-implemented method for generating information for setting up process control for a wafer. One such embodiment is shown in FIG. 1. For example, as shown in FIG. 1, non-transitory computer-readable medium 100 includes program instructions 102 executable on computer system 104 for performing the computer-implemented method for generating information for setting up process control for a wafer. The computer-implemented method for which the program instructions are executable includes the step(s) of the method(s) described herein.

Program instructions 102 implementing methods such as those described herein may be stored on non-transitory computer-readable medium 100. The computer-readable medium may be a storage medium such as a magnetic or optical disk, a magnetic tape or any other suitable computer-readable medium known in the art.

The program instructions may be implemented in any of various ways, including procedure-based techniques, component-based techniques, and/or object-oriented techniques, among others. For example, the program instructions may be implemented using Matlab, Visual Basic, ActiveX controls, C, C++ objects, C#, JavaBeans, Microsoft Foundation Classes ("MFC"), or other technologies or methodologies, as desired.

Computer system 104 may take various forms, including a personal computer system, mainframe computer system, workstation, system computer, image computer, programmable image computer, parallel processor, or any other device known in the art. In general, the term "computer system" may be broadly defined to encompass any device having one or more processors, which executes instructions from a memory medium.

Figure 2:
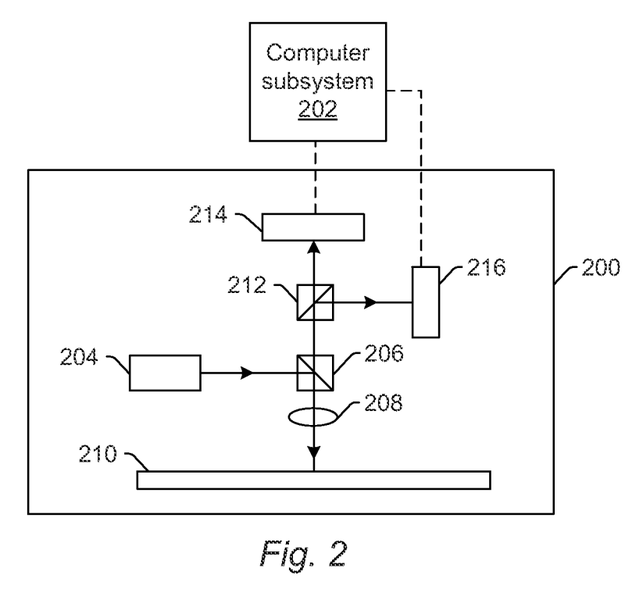
FIG. 2 is a schematic diagram illustrating a side view of one embodiment of a system configured to generate information for setting up process control for a wafer.

An additional embodiment relates to a system configured to generate information for setting up process control for a wafer. One embodiment of such a system is shown in FIG. 2. As shown in FIG. 2, the system includes process control tool 200 and computer subsystem 202. The process control tool is configured to determine information for one or more characteristics of a physical version of a wafer on which at least a portion of a device has been formed. The information and the one or more characteristics may be any information for any characteristics of the wafer that can be determined by one or more of the process control tools described herein. The process control tool embodiment shown in FIG. 2 will be described further herein as a wafer inspection tool. However, the process control tool may be configured as any of the other process control tools described herein (e.g., a wafer defect review tool, a metrology tool, an FA tool, etc.).

As shown in FIG. 2, the process control tool includes light source 204, which may include any suitable light source known in the art. Light from the light source is directed to beam splitter 206, which is configured to direct the light from the light source through tens 208 to wafer 210. The light source may be coupled to any other suitable elements (not shown) such as one or more condensing tenses, collimating lenses, relay lenses, objective lenses, apertures, spectral filters, polarizing components and the like. As shown in FIG. 2, the light may be directed to the wafer at a normal angle of incidence. However, the light may be directed to the wafer at any suitable angle of incidence including near normal and oblique incidence. In addition, the light or multiple light beams may be directed to the wafer at more than one angle of incidence sequentially or simultaneously. The process control tool may be configured to scan the light over the wafer in any suitable manner.

Light reflected from wafer 210 may be collected and detected by multiple channels of the process control tool during scanning. For example, light specularly reflected from wafer 210 may be collected by lens 208. Lens 208 may include a refractive optical element as shown in FIG. 2. In addition, lens 208 may include one or more refractive optical elements and/or one or more reflective optical elements. Light collected by lens 208 may be directed through beam splitter 206 to beam splitter 212, which may be configured to separate the light into two different paths, one of which is directed to detector 214 and another of which is directed to detector 216. The beam splitters shown in FIG. 2 may include any suitable beam splitters known in the art. The detectors shown in FIG. 2 may include any suitable detectors known in the art such as charge coupled devices (CCDs) or another type of imaging detectors. Detectors 214 and 216 are configured to generate output that is responsive to the specularly reflected light. Therefore, each of the detectors form one channel of the process control tool.

Since the process control tool shown in FIG. 2 is configured to detect light specularly reflected from the wafer, the process control tool is configured as a bright field (BF) optical subsystem. Such a process control tool may, however, also be configured for other types of wafer inspection. For example, the process control tool shown in FIG. 2 may also include one or more other channels (not shown). The other channel(s) may include any of the optical components described herein such as a lens and a detector, configured as a scattered light channel. The lens and the detector may be further configured as described herein. In this manner, the process control tool may also be configured for dark field (DF) inspection. In addition, the process control tool shown in FIG. 2 may be replaced with an e-beam inspection tool.

Computer subsystem 202 is configured to acquire the output generated by the process control tool. For example, output generated by the detector(s) during scanning may be provided to computer subsystem 202. In particular, the computer subsystem may be coupled to each of the detectors (e.g., by one or more transmission media shown by the dashed lines in FIG. 2, which may include any suitable transmission media known in the art) such that the computer subsystem may receive the output generated by the detector(s). Computer subsystem 202 is configured to determine the information for the one or more characteristics of the physical version of the wafer using the output. For example, the computer subsystem may be configured to detect defects on the wafer using the output, which may be performed in any suitable manner known in the art.

The process control tool shown in FIG. 2 may also be configured as a metrology tool by careful selection of the elements shown in FIG. 2 and/or by changing one or more parameters of the elements of the process control tool. For example, since the process control tool is shown in FIG. 2 as detecting specularly reflected light, the process control tool may be configured as a reflectometer. However, by changing one or more parameters of the process control tool shown in FIG. 2 such as angle of incidence, polarization of illumination, wavelengths of illumination, angle of collection, polarization of collection, wavelengths of detection, etc., the process control tool may be configured as another type of metrology tool such as a scatterometer, an ellipsometer, a diffractometer, or another type of light-based metrology tool. The light-based metrology tool may also be replaced with an electron beam-based metrology tool such as a SEM. Furthermore, the process control tool may be replaced with any other suitable process control tool known in the art.

The process control tool may be configured to perform an inline process on the wafer in a number of different ways. For example, in one instance, the process control tool may be a tool that is located in a wafer fabrication facility and that is physically isolated from other tools in the facility and when an inline process is to be performed on a physical wafer, the physical wafer may be transferred from its current location in the fabrication facility to the tool. In another instance, the process control tool may be coupled to a fabrication tool (not shown) by a wafer handler (not shown) that can move wafers between the process control tool and the fabrication tool. In an additional instance, the process control tool may be incorporated into the physical housing of the fabrication tool such that it is a subsystem within the fabrication tool. The process control tool may also or alternatively be located within or coupled to a process chamber of a fabrication tool such that the process control tool can perform an inline process on the wafer as the process tool is performing a fabrication process on the wafer. In any case, the process control tool may be configured in a number of different ways such that it can perform an inline process in situ during a process step, in situ between two steps of one process, in situ after a process of the overall fabrication process, or in any other suitable manner.

The computer subsystem may be configured for performing the steps of the computer-implemented method described further herein. For example, the computer subsystem may be configured for automatically identifying potential marginalities in a design for the device and automatically generating information for the potential marginalities. The automatically generated information may include any such information described herein. These steps may be performed as described further herein. The computer subsystem may be configured to perform any other step(s) of any method embodiment(s) described herein. Since the computer subsystem shown in FIG. 2 is coupled directly to the detectors of the process control tool, this computer subsystem may be configured as a computer subsystem that may be included in any wafer inspection, defect review, metrology, etc. tool. In the embodiment shown in FIG. 2, therefore, the same computer subsystem that determined the information for the characteristic(s) of the wafer may perform other steps described herein. In this manner, a process control tool such as a wafer inspection tool, a wafer metrology tool, a wafer defect review tool, etc. may be configured to generate information that can be used to set up process control as described further herein.

However, one or more steps of the computer-implemented method may be performed by a different computer subsystem or additional computer subsystem(s) (not shown). For instance, in one embodiment, automatically identifying the potential marginalines and automatically generating information for the potential marginalines as described herein may be performed by a computer subsystem having a configuration tailored for handling and processing design data for devices being fabricated on wafers. In one such instance, such a computer subsystem may be part of an electronic design automation (EDA) system that has been configured to perform one or more steps as described herein. In another instance, the one or more computer subsystems configured to perform steps of the method described herein may include an EDA tool. In addition, setting up the process control may be performed as described herein by an appropriately configured computer subsystem of an EDA tool or a computer subsystem located in a different facility than a computer subsystem that performs the automatically identifying and automatically generating steps described herein. For instance, as described further herein, some of the steps may be performed by a fabless entity, and others of the steps may be performed by a fab after receiving information from the fabless entity. In this manner, the system described herein may include a number of different computer subsystems that are coupled in some manner (e.g., via transmission media that may be "wired" or "wireless") such that information can be shared among them. The computer subsystem(s), the process control tool, and the system may be further configured as described herein.

It is noted that FIG. 2 is provided herein to generally illustrate one configuration of a process control tool that may be included in the system embodiments described herein. Obviously, the process control tool configuration described herein may be altered to optimize the performance of the process control tool as is normally performed when designing a commercial process control tool. In addition, the systems described herein may be implemented using an existing process control tool (e.g., by adding functionality described herein to an existing process control tool) such as the 29xx/28xx series of tools that are commercially available from KLA-Tencor. For some such systems, the methods described herein may be provided as optional functionality of the system (e.g., in addition to other functionality of the system). Alternatively, the system described herein may be designed "from scratch" to provide a completely new system.

Further modifications and alternative embodiments of various aspects of the invention will be apparent to those skilled in the art in view of this description. For example, methods and systems for extracting comprehensive design guidance for in-line process control of wafers are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A computer-implemented method for generating information for setting up process control for a wafer, comprising:
   automatically identifying potential marginalities in a design for a device to be formed on a wafer; and
   automatically generating information for the potential marginalities, wherein the automatically generated information is used to set up process control for the wafer, and wherein said automatically identifying and said automatically generating are performed by one or more computer systems.

2. The method of claim 1, wherein the automatically generated information is not sufficient for use in fabrication of the device in its entirety.

3. The method of claim 1, wherein the potential marginalities are automatically identified based on information provided by a designer of the device.

4. The method of claim 1, wherein the potential marginalities are automatically identified based on information about electrical, logical, functional, and behavioral attributes of different areas within the device.

5. The method of claim 1, wherein at least one of the potential marginalities is discovered through a simulation.

6. The method of claim 1, wherein at least one of the potential marginalities is discovered through information about criticality of a design element for function or testing of the device.

7. The method of claim 1, wherein at least one of the potential marginalities is discovered through prior knowledge of functional or performance deficiencies of a design element of the device.

8. The method of claim 1, wherein at least one of the potential marginalities is identified based on electrical relevance of elements of the design to function of the device.

9. The method of claim 1, wherein at least one of the potential marginalities is identified based on one or more elements of the design that are designed for testability of the device.

10. The method of claim 1, wherein at least one of the potential marginalities is identified based on constraints on performance of a block in the design.

11. The method of claim 1, wherein automatically generating the information comprises querying design elements corresponding to the potential marginalities against a physical design database for the device.

12. The method of claim 11, wherein automatically generating the information further comprises generating a design data file containing physical design elements that result from said querying.

13. The method of claim 1, wherein the automatically generated information for the potential marginalities comprises one or more physical attributes of physical design elements in the design corresponding to the potential marginalities.

14. The method of claim 1, further comprising modifying one or more physical design elements in the design corresponding to the potential marginalities based on one or more parameters of the process control.

15. The method of claim 1, wherein said automatically identifying and said automatically generating are performed by a fabless entity, and wherein the process control is set up based on the automatically generated information by a fab after receiving the information from the fabless entity.

16. The method of claim 1, wherein the process control comprises an inspection process performed during fabrication of the device.

17. The method of claim 1, wherein the process control comprises a defect review process performed during fabrication of the device.

18. The method of claim 1, wherein the process control comprises a metrology process performed during fabrication of the device.

19. The method of claim 1, wherein the process control comprises a failure analysis process performed after electrical testing of the device.

20. The method of claim 1, wherein the one or more computer systems comprise an electronic design automation tool.

21. The method of claim 1, wherein the design for the device used for said automatically identifying comprises design information that is available prior to design rule checking performed on the design.

22. The method of claim 1, wherein at least some of the potential marginalities are automatically identified prior to design rule checking performed on the design.

23. The method of claim 1, wherein at least some of the potential marginalities are automatically identified at different points in an electronic design automation process performed for the design, and wherein the automatically generated information comprises information for at least two of the potential marginalities that are automatically identified at the different points in the electronic design automation process.

24. The method of claim 1, wherein the automatically generated information comprises information indicating different types of the potential marginalities.

25. The method of claim 24, wherein the information indicating the different types of the potential marginalities is encrypted by an owner of the design.

26. The method of claim 24, wherein the information indicating the different types of the potential marginalities is used to set up different types of the process control for the wafer.

27. A non-transitory computer-readable medium, storing program instructions executable on a computer system for performing a computer-implemented method for generating information for setting up process control for a wafer, wherein the computer-implemented method comprises:

automatically identifying potential marginalities in a design for a device to be formed on a wafer; and automatically generating information for the potential marginalities, wherein the automatically generated information is used to set up process control for the wafer.

28. A system configured to generate information for setting up process control for a wafer, comprising:

a process control tool configured to determine information for one or more characteristics of a physical version of a wafer on which at least a portion of a device has been formed; and one or more computer subsystems configure for:

automatically identifying potential marginalities in a design for the device; and automatically generating information for the potential marginalities, wherein the automatically generated information is used to set up process control for the wafer performed by the process control tool.

29. The system of claim 28, wherein the automatically generated information is not sufficient for use in fabrication of the device in its entirety.

30. The system of claim 28, wherein the potential marginalities are automatically identified based on information provided by a designer of the device.

31. The system of claim 28, wherein the potential marginalities are automatically identified based on information about electrical, logical, functional, and behavioral attributes of different areas within the device.

32. The system of claim 28, wherein at least one of the potential marginalities is discovered through a simulation.

33. The system of claim 28, wherein at least one of the potential marginalities is discovered through information about criticality of a design element for function or testing of the device.

34. The system of claim 28, wherein at least one of the potential marginalities is discovered through prior knowledge of functional or performance deficiencies of a design element of the device.

35. The system of claim 28, wherein at least one of the potential marginalities is identified based on electrical relevance of elements of the design to function of the device.

36. The system of claim 28, wherein at least one of the potential marginalities is identified based on one or more elements of the design that are designed for testability of the device.

37. The system of claim 28, wherein at least one of the potential marginalities is identified based on constraints on performance of a block in the design.

38. The system of claim 28, wherein automatically generating the information comprises querying design elements corresponding to the potential marginalities against a physical design database for the device.

39. The system of claim 38, wherein automatically generating the information further comprises generating a design data file containing physical design elements that result from said querying.

40. The system of claim 28, wherein the automatically generated information for the potential marginalities comprises one or more physical attributes of physical design elements in the design corresponding to the potential marginalities.

41. The system of claim 28, further comprising modifying one or more physical design elements in the design corresponding to the potential marginalities based on one or more parameters of the process control.

42. The system of claim 28, wherein said automatically identifying and said automatically generating are performed by a fabless entity, and wherein the process control is set up based on the automatically generated information by a fab after receiving the information from the fabless entity.

43. The system of claim 28, wherein the process control comprises an inspection process performed during fabrication of the device.

44. The system of claim 28, wherein the process control comprises a defect review process performed during fabrication of the device.

45. The system of claim 28, wherein the process control comprises a metrology process performed during fabrication of the device.

46. The system of claim 28, wherein the process control comprises a failure analysis process performed after electrical testing of the device.

47. The system of claim 28, wherein the one or more computer systems comprise an electronic design automation tool.

48. The system of claim 28, wherein the design for the device used for said automatically identifying comprises design information that is available prior to design rule checking performed on the design.

49. The system of claim 28, wherein at least some of the potential marginalities are automatically identified prior to design rule checking performed on the design.

50. The system of claim 28, wherein at least some of the potential marginalities are automatically identified at different points in an electronic design automation process performed for the design, and wherein the automatically generated information comprises information for at least two of the potential marginalities that are automatically identified at the different points in the electronic design automation process.

51. The system of claim 28, wherein the automatically generated information comprises information indicating different types of the potential marginalities.

52. The system of claim 51, wherein the information indicating the different types of the potential marginalities is encrypted by an owner of the design.

53. The system of claim 51, wherein the information indicating the different types of the potential marginalities is used to set up different types of the process control for the wafer.

* * * * *